(12) United States Patent
Callicoat et al.

(10) Patent No.: US 9,915,703 B2
(45) Date of Patent: Mar. 13, 2018

(54) VOLTAGE SENSING SYSTEM AND METHOD

(71) Applicant: FORD GLOBAL TECHNOLOGIES, LLC, Dearborn, MI (US)

(72) Inventors: Debbi Callicoat, Livonia, MI (US); Robert Bolduc, Allen Park, MI (US); Ben A. Tabatowski-Bush, South Lyon, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 251 days.

(21) Appl. No.: 14/054,900

(22) Filed: Oct. 16, 2013

(65) Prior Publication Data

US 2015/0102815 A1    Apr. 16, 2015

(51) Int. Cl.
*G01R 31/36* (2006.01)

(52) U.S. Cl.
CPC ....... *G01R 31/362* (2013.01); *G01R 31/3658* (2013.01)

(58) Field of Classification Search
CPC .................................................. G01R 31/362
USPC ....................................................... 324/426
See application file for complete search history.

(56) References Cited

U.S. PATENT DOCUMENTS

| | | | |
|---|---|---|---|
| 5,670,861 A | 9/1997 | Nor | |
| 7,489,048 B2* | 2/2009 | King | B60L 11/1864 307/10.1 |
| 7,791,310 B2 | 9/2010 | Luz et al. | |
| 7,876,071 B2 | 1/2011 | Chen et al. | |
| 8,808,031 B2* | 8/2014 | Zhao | H01M 2/206 439/620.27 |
| 8,981,721 B2* | 3/2015 | Yamauchi | B60L 3/0046 320/116 |
| 9,013,839 B1* | 4/2015 | Vander Laan | H02H 3/093 361/23 |
| 9,705,356 B2* | 7/2017 | Desbois-Renaudin | H02J 7/34 |
| 2005/0073282 A1* | 4/2005 | Carrier | B25F 5/00 320/106 |
| 2008/0100265 A1 | 5/2008 | Lim et al. | |
| 2013/0288530 A1* | 10/2013 | Zhao | H01M 2/206 439/627 |
| 2016/0254686 A1* | 9/2016 | Steil | B60L 3/0046 320/112 |

\* cited by examiner

*Primary Examiner* — M'Baye Diao
(74) *Attorney, Agent, or Firm* — David B. Kelley; Brooks Kushman P.C.

(57) ABSTRACT

A voltage sensing system for a vehicle traction battery having a plurality of cells includes: a battery controller, a plurality of electrical circuits, each being respectively connected to at least one of the cells and including an electrical component for limiting current therethrough, and a plurality of wires, each being respectively connected to one of the electrical circuits in series with a respective one of the electrical components for limiting current and the controller.

23 Claims, 2 Drawing Sheets

VOLTAGE SENSING SYSTEM AND METHOD

TECHNICAL FIELD

The present invention relates to a voltage sensing system and method.

BACKGROUND

Depending on the application where it is used, sensing the voltage of a battery can be important for a number of reasons. For example, in the case of electric or hybrid electric vehicles, which may utilize high-voltage batteries made up of many smaller battery cells, knowing the voltage in each cell or a group of cells can be important for many control functions, including the control of regenerative braking decisions, whether to propel the vehicle using an engine or electric motor, and how to control the various electrical loads within the vehicle—e.g., air conditioning—just to name a few. In applications such as these, an electrical conductor, such as a wire may be used to carry voltage information from a cell or cells to a controller in the vehicle. Under ordinary circumstances, such a wire will carry only a low current load, and therefore may be of a relatively small gauge.

If two or more of these wires are shorted together, the battery cells they are connected to will also be shorted together, and large amounts of current could then be drawn through these wires, which may not be equipped to handle such a load. Protecting the wires through the addition of an in-line current protector, such as a fuse, is generally not a good solution to the potential problem. First, there may be industry design standards that prohibit using in-line components for these "sensing wires". Moreover, splicing components into a small-gauge sensing wire creates new problems, such as supporting the wire with the additional weight of the component so as to not overstress the two splices where the wire connects to the component. Therefore, there is an ongoing problem throughout the life of the vehicle with ensuring the reliability of the splices—e.g., if one of them becomes disconnected or partially disconnected, erroneous voltage information or no information may be transmitted to the controller.

Therefore, a need exists for a system and method for protecting voltage sensing wires from unexpectedly large current loads, without relying on in-line fuse protection.

SUMMARY

At least some embodiments of the present invention include a voltage sensing system for a vehicle traction battery having a plurality of cells. The voltage sensing system includes: a battery controller, which may be, for example, configured to determine voltages of the cells based on inputs from the cells, a plurality of electrical circuits, each being respectively connected to at least one of the cells and including an electrical component for limiting current therethrough, and a plurality of wires, each being respectively connected to the controller and one of the electrical circuits in series with a respective one of the electrical components for limiting current through the wire.

At least some embodiments of the present invention include a voltage sensing system for a vehicle traction battery having a plurality of cells. The voltage sensing system includes: a controller configured to determine voltage based on an input from at least one of the cells. The sensing system further includes a conductor electrically connected to at least one of the cells and the controller, and an electrical circuit connected to the at least one of the cells and the conductor, and including an electrical component for limiting current through the conductor.

At least some embodiments of the present invention include a voltage sensing system for a vehicle traction battery having a battery controller configured to determine voltage of individual ones of a plurality of cells. The voltage sensing system includes: an electrical circuit connected to one of the cells and including a current-limiting electrical component in series between the one cell and the controller, and a wire connected to the electrical circuit and the controller.

At least some embodiments of the present invention include a voltage sensing method for a vehicle having a traction battery with a plurality of cells coupled to a controller. The method includes limiting current through each of a plurality of electrical circuits each respectively connected to at least one of the plurality of cells and the controller.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
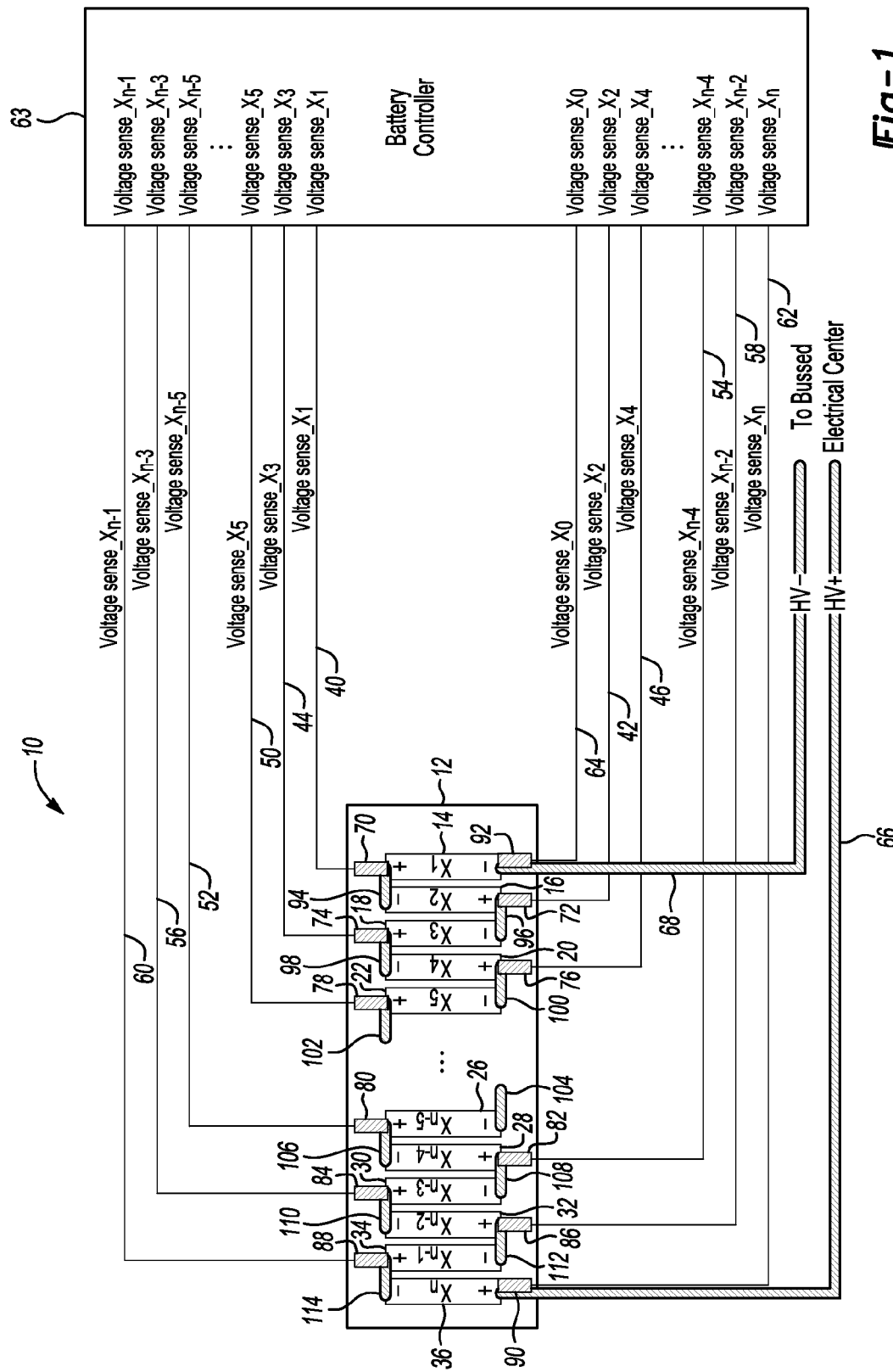
FIG. 1 is a schematic representation of a voltage sensing system in accordance with an embodiment of the present invention.

FIG. 1 shows a schematic representation of a voltage sensing system 10 in accordance with an embodiment of the present invention. The voltage sensing system 10 is, in the example shown in FIG. 1, being used with a high-voltage traction battery 12 of the type that may be used, for example, with an electric or hybrid electric vehicle, and specifically, with a traction motor of such a vehicle. The battery 12 is made up of a number of battery cells 14, 16, 18, 20, 22, 26, 28, 30, 32, 34, 36. In the drawing figure, the cells are labeled $X_1, X_2, X_3, X_4, X_5 \ldots X_{n-5}, X_{n-4}, X_{n-3}, X_{n-2}, X_{n-1}, X_n$, indicating that there may be any number of cells in the battery 12, only eleven of which are illustrated in FIG. 1.

Electrically connected to each of the cells 14-36 is a conductor, which in this example is a small-gauge wire 40, 42, 44, 46, 50, 52, 54, 56, 58, 60, 62. One end of each of the wires 40-62 is connected to a positive terminal of a respective one of the cells 14-36, while another end of each of the wires 40-62 is terminated at a battery controller 63, which is configured to determine the voltages of the cells 14-36. Each of the wires 40-62 provides an input to the controller 63, and the input is compared to a reference voltage from the prior adjacent cell. For example, the input from cell 16, provided by the wire 42, is compared by the controller 63 to the input from cell 14, provided by the wire 40. The input from cell 14 acts as a reference voltage for determination of the voltage in cell 16. The method is the same for each of the cells except cell 14, which has no prior adjacent cell. Therefore, to facilitate determination of the voltage of cell 14, another wire 64 is connected to a negative terminal of the cell 14 and also terminates at the battery controller 63. The wire 64 provides the reference input to the controller 63 for the cell 14. Also shown in FIG. 1 are conductors 66, 68, respectively providing the positive and negative high-voltage output from the battery 12 to a bussed electrical center.

Although the embodiment illustrated in FIG. 1 shows each of the cells 14-36 connected to the controller 63 via its own conductor 40-62, thereby providing separate inputs to the controller 63 for each of the cells 14-36, in other embodiments only some of the cells may be configured to have their voltage sensed, or alternatively, groups of cells can be connected together and have their voltage determined collectively. In some battery cell arrangements, at least some of the cells may be connected in parallel, in which case a measurement of each parallel group would provide a measurement of the voltage of each of the cells. Thus, the present invention contemplates various configurations for voltage sensing.

Also shown in FIG. 1, are a plurality of electrical circuits, illustrated schematically by printed circuit boards 70, 72, 74, 76, 78, 80, 82, 84, 86, 88, 90. Each of the electrical circuits, and in this embodiment the circuit boards 70-90, is respectively connected to one of the cells 14-36 and is also connected to a respective one of the wires 40-62. In different embodiments, where not all of the cells have their voltage sensed, electrical circuits may be connected to only certain ones of the cells. In this embodiment, however, each of the electrical circuits is connected to a single respective cell. An additional electrical circuit, shown as circuit board 92, is connected to the negative terminal of the cell 14 and to the wire 64 carrying the reference voltage to the battery controller 63. As explained in more detail below, each of the electrical circuits is configured with an electrical component connected in series with a respective one of the wires 40-62 for limiting current flow therethrough. In this way, an over-current protection is provided for each of the wires 40-64, which may be of a relatively small gauge and configured to carry a low level of current.

Connected to each of the cells 14-36 is at least one busbar 94, 96, 98, 100, 102, 104, 106, 108, 110, 112, 114. In the embodiment shown in FIG. 1, each of the bus bars 94-114 connects a positive terminal from one cell to a negative terminal of an adjacent cell, thereby connecting each of the cells in series. Each of the circuit boards 70-90 is respectively connected to a positive cell terminal through one of the bus bars 94-114; conversely, the circuit board 92 is connected directly to the negative terminal of the cell 14, which has no bus bar. With the series arrangement shown in FIG. 1, a battery such as the battery 12 having 70-80 cells, each with an output voltage of 3.5-4 Volts (V), may have a total output voltage close to 300 V. In such an application, the sensing wires 40-62 will typically carry a very low level of current, for example, approximately 100 milliAmperes (mA), but as a design consideration, the wires are chosen such that they are capable of carrying much greater current loads. For example, for the application illustrated in FIG. 1—i.e., voltage sensing for a high voltage battery in a vehicle—the wires may be, for example, 22 AWG (American Wire Gauge), which may be able to carry 10 A or more of current, depending on the ambient temperature and the type of insulation on the wire. Therefore, as used herein, a wire that is configured—e.g., chosen—to carry a "low level of current" will be rated for carrying 10 A or less.

Figure 2:
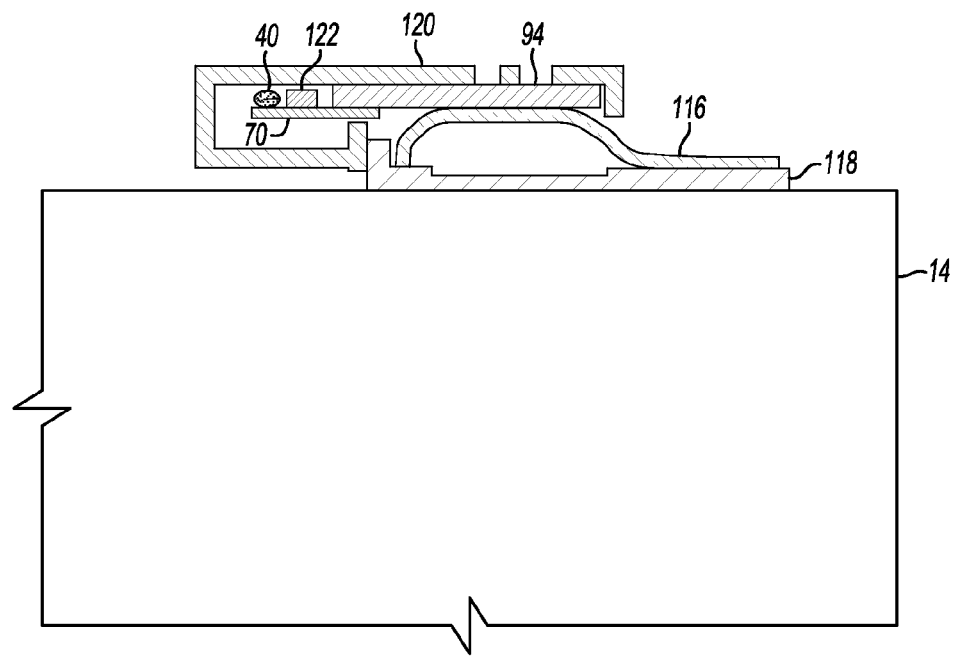
FIG. 2 is a side view of a portion of the voltage sensing system 10 shown in FIG. 1.

FIG. 2 shows a side view of a portion of the battery cell 14. In particular, the positive terminal 116 is shown along the top portion of the prismatic cell 14, and it is isolated from the cell "can" by a plastic holder 118, which also serves to help support the terminal 116. As shown in FIG. 2, the busbar 94 is electrically connected to the terminal 116, and it is also electrically connected to the circuit board 70. The busbar 94, like the other bus bars 96-114, may be attached to their respective circuit boards 72-90 via welding, soldering or even an electrically conductive adhesive, depending on the particular application. A plastic housing 120 at least partially surrounds the busbar 94 and the circuit board 70, and provides electrical isolation and protection from contact with other cells or even other non-battery components. Attached to the circuit printed on the circuit board 70 is the wire 40, which can also be attached to the circuit board 70 via welding, soldering or through some other electrically conductive means.

Attached to the circuit board 70 is an electrical component 122 configured to limit the amount of current flowing through it. The electrical component 122, may be, for example, a fuse or a resistor. For the application described herein, where 100 mA may be typically seen by the wires 40-62, a 1 A fuse may be appropriate for use on the circuit boards 70-90. Where a resistor is used instead of a fuse, a 0.5 Ohm resistor may be appropriate. The component 122 may be attached to the circuit printed on the circuit board 70 through any effective means, such as through surface mount technology (SMT), wave soldering, etc. Because the electrical circuit printed on the circuit board 70 is disposed between the wire 40 and the terminal 116 of the battery 14, current passing through the wire 40 will be limited to a level that is allowed to flow through the component 122.

Figure 3:
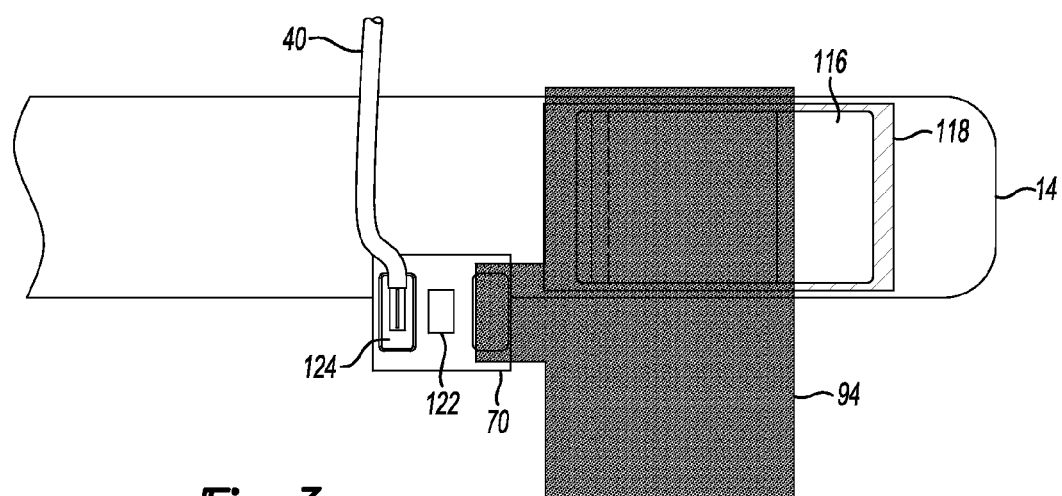
FIG. 3 is a top view of the portion of the voltage sensing system shown in FIG. 2.

FIG. 3 shows a top view of the components shown in FIG. 2. As shown in FIG. 3, the wire 40 is attached to the circuit board 70 via a welding pad 124. FIG. 3 clearly illustrates the differences between the over-current protection provided by the voltage sensing system of the present invention and in-line devices. As discussed above, in-line devices require two spliced connection points, which in the case of the wire 40, would be somewhere between its connection point at the cell 14 and the battery controller 63—see also FIG. 1. Conversely, embodiments of the present invention require no splices in the conductors—i.e. the voltage sense wires— to provide over-current protection. Rather, as illustrated in the drawing figures and described above, each of the conducting wires may be terminated at the battery controller on one end and the electrical circuit at the other end, with the over-current protection being provided by one or more electrical components in the electric circuit. Although the embodiments of the present invention illustrated and described herein are related to voltage sensing for battery cells in a high-voltage battery in a vehicle, where relatively low levels of current may be typical, the present invention may also be used in other applications having relatively high nominal current loads, but were in-line current protection is impractical or impracticable.

While embodiments of a system in accordance with the present invention are described above, a voltage sensing method in accordance with an embodiment the present invention, and in particular, a voltage sensing method for a vehicle having a traction battery with a plurality of cells coupled to a controller, may include, for example, the step of limiting current through each of a plurality of electrical circuits each respectively connected to at least one of the plurality of cells and the controller—see, e.g., the electrical circuits 70-90 and the battery cells 14-36 shown in FIG. 1. The step of limiting current may include integrating a fuse or a resistor into one of the electrical circuits such that the fuse is connected in series between the at least one of the cells and the controller.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A voltage sensing system for a vehicle traction battery having a plurality of cells, comprising:
    an electrical circuit connected to one of the cells and including a current-limiting electrical component in series between the one cell and a battery controller; and
    a wire having opposite ends respectively connected to the electrical circuit and the controller such that over-current protection for the wire is provided in a non-in-line configuration exclusively, including by the current-limiting electrical component.

2. The voltage sensing system of claim 1, further comprising a printed circuit board having the electrical circuit disposed thereon.

3. The voltage sensing system of claim 2, further comprising a plurality of the electrical circuits, a plurality of the printed circuit boards and a plurality of the wires, each of the electrical circuits being respectively disposed on one of the printed circuit boards, each of the printed circuit boards being respectively connected to at least one of the cells and one of the wires.

4. The voltage sensing system of claim 3, wherein each of the printed circuit boards is connected to a single respective cell.

5. The voltage sensing system of claim 3, wherein each of the cells includes at least one bus bar attached, and at least some of the printed circuit boards are respectively connected to the at least one of the cells through a respective one of the bus bars.

6. The voltage sensing system of claim 3, wherein each of the wires is configured to carry a low level of current.

7. The voltage sensing system of claim 1, wherein the electrical component is one of a resistor or a fuse.

8. A voltage sensing system for a vehicle traction battery having a plurality of cells, comprising:
    a battery controller;
    an electrical circuit connected to at least one of the cells and including a current-limiting electrical component; and
    a wire having non-in-line current protection exclusively, including one end connected to the controller and another end connected to the electrical circuit such that current through the wire is limited by the current-limiting electrical component.

9. The voltage sensing system of claim 8, further comprising a bus bar connecting one pole of one cell to an opposite pole of another cell, and wherein the electrical circuit is connected to the at least one of the cells through the bus bar.

10. The voltage sensing system of claim 8, further comprising a plurality of the electrical circuits, wherein each of the electrical circuits is connected to a single respective cell.

11. The voltage sensing system of claim 8, wherein the current-limiting electrical component is one of a resistor or a fuse.

12. The voltage sensing system of claim 8, wherein the wire is configured to carry a low level of current.

13. A voltage sensing system for a vehicle traction battery having a plurality of cells, comprising:
    a controller configured to determine voltage based on an input from at least one of the cells;
    a wire having one end connected to the controller and another end to an electrical circuit connected to at least one of the cells; and
    wherein the electrical circuit includes a current-limiting electrical component providing non-in-line current protection for the wire exclusively.

14. The voltage sensing system of claim 13, further comprising a bus bar attached to one of the cells at one pole and another of the cells at an opposite pole.

15. The voltage sensing system of claim 13, wherein the current-limiting electrical component is one of a resistor or a fuse.

16. The voltage sensing system of claim 13, further comprising a plurality of the wires, each of the wires being electrically connected to a respective one or more of the cells and to the controller for providing separate inputs to the controller for each of the one or more cells.

17. The voltage sensing system of claim 16, wherein each of the wires is electrically connected to a single respective cell and the controller.

18. The voltage sensing system of claim 16, wherein each of the wires is configured to carry a low level of current.

19. A voltage sensing system for a vehicle traction battery having a plurality of cells, comprising:
    a battery controller;
    an electrical circuit connected to at least one of the cells; and
    a wire having over-current protection with a non-in-line configuration exclusively, including one end of the wire connected to the battery controller and another end of the wire connected to the electrical circuit having a current-limiting electrical component.

20. The voltage sensing system of claim 19, further comprising a bus bar connecting one pole of one cell to an opposite pole of another cell, and wherein the electrical circuit is connected to the at least one of the cells through the bus bar.

21. The voltage sensing system of claim 19, further comprising a plurality of the electrical circuits, wherein each of the electrical circuits is connected to a single respective cell.

22. The voltage sensing system of claim 19, wherein the current-limiting electrical component is one of a resistor or a fuse.

23. The voltage sensing system of claim 19, wherein the wire is configured to carry a low level of current.

* * * * *